US010438669B2

(12) United States Patent
Moshayedi

(10) Patent No.: US 10,438,669 B2
(45) Date of Patent: Oct. 8, 2019

(54) FLASH STORAGE DEVICE WITH DATA INTEGRITY PROTECTION

(71) Applicant: Western Digital Technologies, Inc., San Jose, CA (US)

(72) Inventor: Mark Moshayedi, Newport Coast, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/216,904

(22) Filed: Dec. 11, 2018

(65) Prior Publication Data

US 2019/0108887 A1    Apr. 11, 2019

Related U.S. Application Data

(60) Division of application No. 14/788,658, filed on Jun. 30, 2015, now Pat. No. 10,181,355, which is a continuation of application No. 13/530,026, filed on Jun. 21, 2012, now Pat. No. 9,087,599, which is a continuation of application No. 12/511,990, filed on Jul. 29, 2009, now Pat. No. 8,228,753.

(51) Int. Cl.
| G11C 16/04 | (2006.01) |
| G11C 16/30 | (2006.01) |
| G11C 5/14  | (2006.01) |
| G11C 16/10 | (2006.01) |

(52) U.S. Cl.
CPC .............. *G11C 16/30* (2013.01); *G11C 5/141* (2013.01); *G11C 5/144* (2013.01); *G11C 16/10* (2013.01)

(58) Field of Classification Search
CPC .......... G11C 16/30; G11C 16/10; G11C 5/141; G11C 5/144
USPC .... 365/185.18, 189.07, 189.09, 189.11, 149, 365/226
See application file for complete search history.

(56) References Cited

U.S. PATENT DOCUMENTS

| 5,519,663 | A  | 5/1996  | Harper, Jr. et al. |
| 6,473,355 | B2 | 10/2002 | Caulkins |
| 6,483,745 | B2 | 11/2002 | Saeki |
| 6,735,117 | B2 | 5/2004  | Ott |
| 7,072,232 | B2 | 7/2006  | Shiota et al. |
| 7,126,857 | B2 | 10/2006 | Hajeck |
| 7,269,755 | B2 | 9/2007  | Moshayedi et al. |
| 7,395,452 | B2 | 7/2008  | Nicholson et al. |
| 7,733,712 | B1 | 6/2010  | Walston et al. |
| 8,228,753 | B2 | 7/2012  | Moshayedi |
| 2002/0165622 | A1 | 11/2002 | Fujii |
| 2005/0099873 | A1 | 5/2005  | Yoshida |
| 2005/0240814 | A1 | 10/2005 | Sasakura et al. |
| 2007/0006013 | A1 | 1/2007  | Moshayedi et al. |
| 2010/0226194 | A1 | 9/2010  | Huang |

(Continued)

*Primary Examiner* — Connie C Yoha
(74) *Attorney, Agent, or Firm* — Morgan, Lewis & Bockius LLP

(57) ABSTRACT

A flash storage device includes a power hold circuit including a double layer capacitor. A power source supplies power to the flash storage device and charges the double layer capacitor. The double layer capacitor supplies power for maintaining integrity of data during a data transfer occurring in the flash storage device when the power supplied by the power source is disrupted. Additionally, the flash storage device can inhibit subsequent data transfers until the power supplied by the power source is restored.

19 Claims, 5 Drawing Sheets

(56) References Cited

U.S. PATENT DOCUMENTS

2010/0302860 A1* 12/2010 Oh .................... G11C 11/5628
365/185.19
2010/0329064 A1    12/2010 Wilson
2011/0019475 A1*  1/2011 Moshayedi ......... G06F 12/0607
365/185.11
2016/0070470 A1*  3/2016 Uchida ................. G06F 3/061
711/103

* cited by examiner

FLASH STORAGE DEVICE WITH DATA INTEGRITY PROTECTION

CROSS-REFERENCES TO RELATED APPLICATIONS

The present application claims the benefit of priority under 35 U.S.C. § 120 and is a divisional of U.S. patent application Ser. No. 14/788,658, entitled "FLASH STORAGE DEVICE WITH DATA INTEGRITY PROTECTION," filed on Jun. 30, 2015, which claims the benefit of priority under 35 U.S.C. § 120 and is a continuation of U.S. patent application Ser. No. 13/530,026 entitled "FLASH STORAGE DEVICE WITH DATA INTEGRITY PROTECTION," filed on Jun. 21, 2012, now issued as U.S. Pat. No. 9,087,599, which claims the benefit of priority under 35 U.S.C. § 120 and is a continuation of U.S. patent application Ser. No. 12/511,990 entitled "SYSTEM AND METHOD OF MAINTAINING DATA INTEGRITY IN A FLASH STORAGE DEVICE," filed on Jul. 29, 2009, now issued as U.S. Pat. No. 8,228,753, the entirety of each of which is incorporated by reference herein.

BACKGROUND

The present invention generally relates to flash storage devices. More particularly, the present invention relates to systems and methods of maintaining data integrity when a power disruption occurs in a flash storage device.

A portable electronic device may include a flash storage device for storing data. Although the flash storage device stores data after the portable device is powered-down, the flash storage device is generally sensitive to power disruptions occurring during normal operation as a result of battery discharge or drop-off. In particular, data written into the flash storage device during a power disruption is susceptible to corruption. Thus, various techniques have been proposed to reduce data corruption caused by a power disruption in a flash storage device.

In one technique for reducing data corruption in a flash storage device, a power supply in the portable electronic device alerts the flash storage device of a power disruption and maintains power in the flash storage device for a sufficient time to complete a data write operation in the flash storage device. In this way, integrity of the data in the write operation is maintained and corruption of the data in the flash storage device is avoided. Other than completing the write operation, the portable device does not perform other read or write operations until power is restored to the flash memory device. Some portable electronic devices, however, are not equipped to maintain power in a flash storage device during a power disruption or to alert the flash storage device of the power disruption. Consequently, data in the flash storage device may become corrupted during a power disruption in the flash storage device.

In light of the above, a need exists for a flash storage device that maintains integrity of data during a write operation when a power disruption occurs in the flash storage device.

SUMMARY

In various embodiments, a flash storage device includes a power hold circuit 140 including a double layer capacitive element. A power source supplies power to the flash storage device and charges the double layer capacitive element. The double layer capacitive element supplies power for maintaining integrity of data during a data transfer occurring in the flash storage device when the power supplied by the power source is disrupted. Moreover, a power monitoring circuit monitors the power source and inhibits a subsequent data transfer until the power supplied by the power source is restored.

A method, in accordance with one embodiment, maintains data integrity in a flash storage device comprising a double layer capacitive element. The method includes supplying a first voltage and charging the double layer capacitive element in the flash storage system to a second voltage in response to the first voltage. The method also includes initiating a data transfer in the flash storage device before the first voltage drops below a first threshold voltage. Additionally, the method comprises completing the data transfer before the second voltage drops below a second voltage threshold at which data integrity is maintained for the data transfer.

A system, in accordance with one embodiment, includes a flash storage, a flash storage controller, and a power hold circuit 140. The flash storage controller is electrically coupled to the flash storage. The power hold circuit 140 is electrically coupled to the flash storage controller and the flash storage. The power hold circuit 140 includes a double layer capacitive element configured to charge to a second voltage in response to a first voltage. The flash storage controller is configured to initiate a data transfer to the flash storage before the first voltage drops below the first threshold voltage. The flash storage controller is also configured to complete the data transfer before the second voltage drops below a second voltage threshold at which data integrity is maintained for the data transfer.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION

In various embodiments, a power hold circuit 140 includes a double layer capacitive element. The double layer capacitive element provides power for maintaining data integrity when a power disruption occurs during a data transfer in the flash storage device. In further embodiments, the flash storage device inhibits subsequent data transfers in response to the power disruption until power is restored in the flash storage device.

Figure 1:
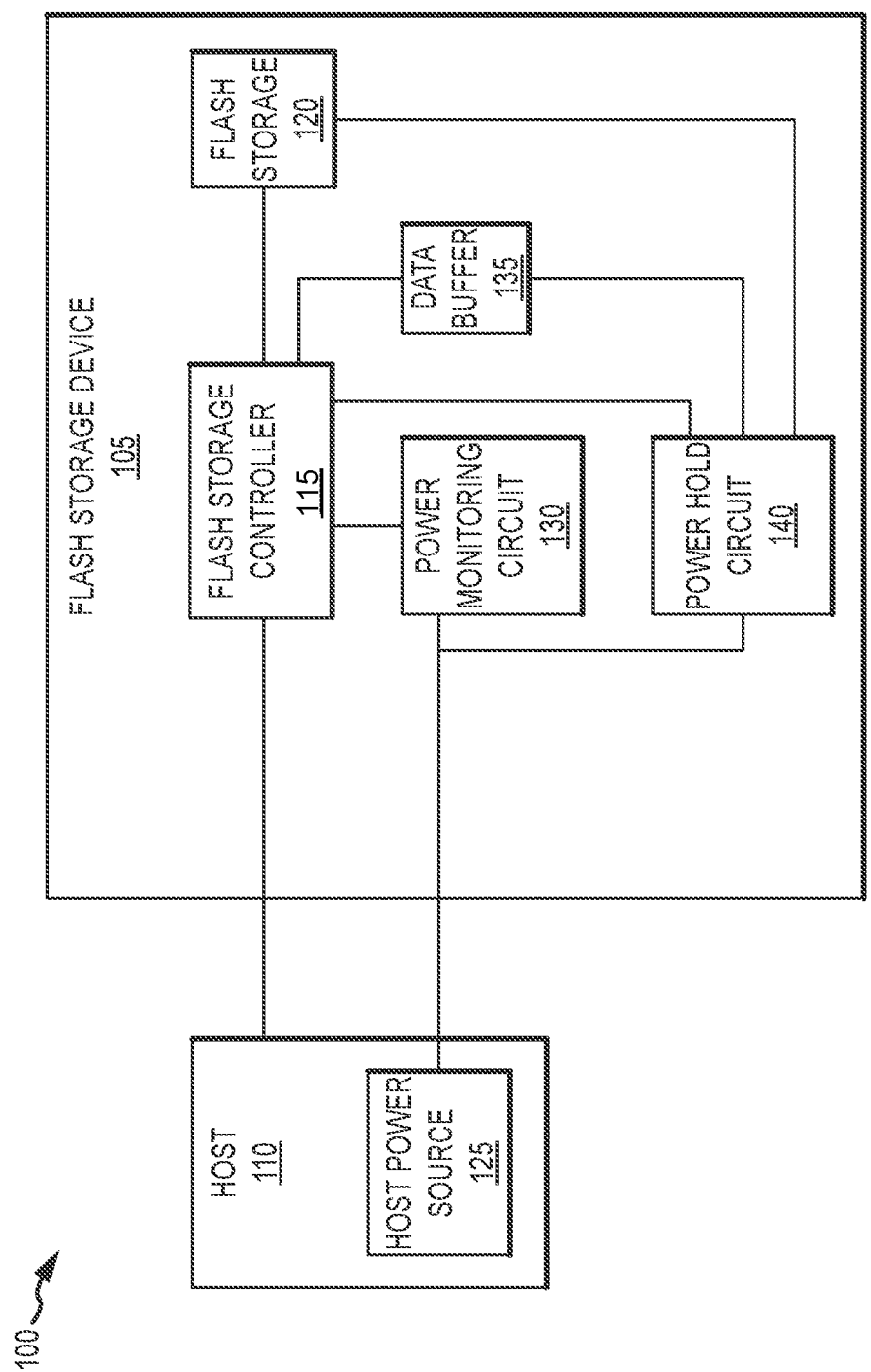
FIG. 1 is a block diagram of an electronic system including a flash storage device, in accordance with an embodiment of the present invention.

FIG. 1 illustrates an electronic system 100, in accordance with an embodiment of the present invention. The electronic system 100 includes a host 110 coupled to a flash storage device 105. The host 110 includes a host power source 125 that provides power to the flash storage system 105. The host 110 can be any computing or electronic device, such as a personal computer, portable computer, personal digital assistant, digital camera, or mobile phone. The flash storage device 105 includes a flash storage controller 115, a flash storage 120, a power monitoring circuit 130, a data buffer 135, and a power hold circuit 140. The flash storage controller 115 is electrically coupled to the host 110, the flash storage 120, and the data buffer 135. The power monitoring circuit 130 is electrically coupled to the host power supply 125 and the flash storage controller 115. The power hold circuit 140 is electrically coupled to the host power supply 125, the flash storage controller 115, the flash storage 120, and the data buffer 135.

The host 110 issues programming commands to the flash storage controller 115 for accessing data in the flash storage 120. The flash storage controller 115 processes the programming commands to access the data in the flash storage 120. The flash storage controller 115 can be a microprocessor, an embedded microprocessor, a controller, an embedded controller, a logic circuit, or the like. The flash storage 120 is a non-volatile memory that stores the data. For example, the flash storage 120 can be a flash storage chip. The data buffer 135 can be a static memory, a dynamic memory or any random access memory. For example, the data buffer 135 can be a synchronous dynamic random access memory (SDRAM).

The flash storage controller 115 receives a programming command from the host 110 and performs a data operation based on the programming command to access data in the flash storage 120. A programming command received from the host 110 may be a read command for reading data stored in the flash storage 120, a write command for writing data into the flash storage 120, or a read-modify-write command for modifying a portion (i.e., a data portion) of data stored in the flash storage 120. In response to receiving a programming command, the flash storage controller 115 performs one or more data transfers based on the programming command to access data in the flash storage 120.

In response to receiving a read command, the flash storage controller 115 performs data transfers to transfer data in the flash storage 120 to the host 110. In one embodiment, the flash storage controller 115 performs each data transfer by reading a data portion of the data stored in the flash storage 120 and providing the data portion to the host 110. For example, the data can be a memory block, and the data portion can be a byte, word, page, or sector of the memory block. In another embodiment, the flash storage controller 115 reads the data stored in the flash storage 120 and writes the data into the data buffer 135. The flash storage controller 115 then performs a data transfer for each data portion of the data by reading the data portion in the data buffer 135 and providing the data portion to the host 110.

In response to a write command, the flash storage controller 115 performs one or more data transfers to transfer data of the write command into the flash storage 120. The data of the write command may include data portions. For example, the data of the write command can be a memory block, and each data portion can be a word, byte, page, or sector in the memory block. In one embodiment, the flash storage controller 115 writes the data of the write command into the data buffer 135 and then performs a data transfer for each data portion of the data by reading the data portion in the data buffer 135 and writing the data portion into the flash storage 120. In one embodiment, the flash storage controller 115 writes the data portions into one or more storage blocks in the flash storage 120. In this embodiment, the flash storage controller 115 can erase a storage block in the flash storage 120 before writing a data portion of the data into the storage block.

In response to a read-modify-write command, the flash storage controller 115 performs data transfers to transfer data portions of the read-modify-write command into the flash storage 120 to replace some data portions of data stored in the flash storage 120. For example, the data can be a memory block, and each data portion can be a word, byte, page, or sector in the memory block. In one embodiment, the flash storage controller 115 writes the data portions of the read-modify-write command into the data buffer 135, reads any remaining data portions of the data stored in the flash storage 120, and writes the remaining data portions into the data buffer 135. The flash storage controller 115 then performs a data transfer for each data portion of the data by reading the data portion in the data buffer 135 and writing the data portion into the flash storage 120. In one embodiment, the flash storage controller 115 writes the data portions into one or more storage blocks in the flash storage 120. In this embodiment, the flash storage controller 115 can erase a storage block in the flash storage 120 before writing a data portion of the data into the storage block.

The host power source 125 supplies power to the power hold circuit 140. In response to the power from the host power source 125, the power hold circuit 140 supplies power to the flash controller 115, the flash storage 120, and the data buffer 135. The power monitoring circuit 130 monitors the host power supply 125 to determine whether a power disruption occurs in the power supplied by the host power source 125 to the flash storage device 105. In one embodiment, the power monitoring circuit 130 provides a signal to the flash storage controller 115 indicating a power disruption in the power supplied by the host power source 125 to the flash storage device 105. In response to the signal from the power monitoring circuit 130, the flash controller 115 complete any data transfer in progress but inhibits any additional data transfers from occurring until the host power source 125 restores power to the flash storage device 105.

In addition to supplying power to the flash storage controller 115, the flash storage 120, and the data buffer 135, the power hold circuit 140 stores power in response to the power received from the host power source 125. The power hold circuit 140 provides power stored in the power hold circuit 140 to the flash storage controller 115, the flash storage 120, and the data buffer 135 if a power disruption occurs in the power supplied to the power hold circuit 140 from the host power source 125 during a data transfer. The power supplied by the power hold circuit 140 is sufficient to maintain integrity of data in the data transfer until the data transfer is complete. In this way, corruption of data in the flash storage 120 is avoided.

Figure 2:
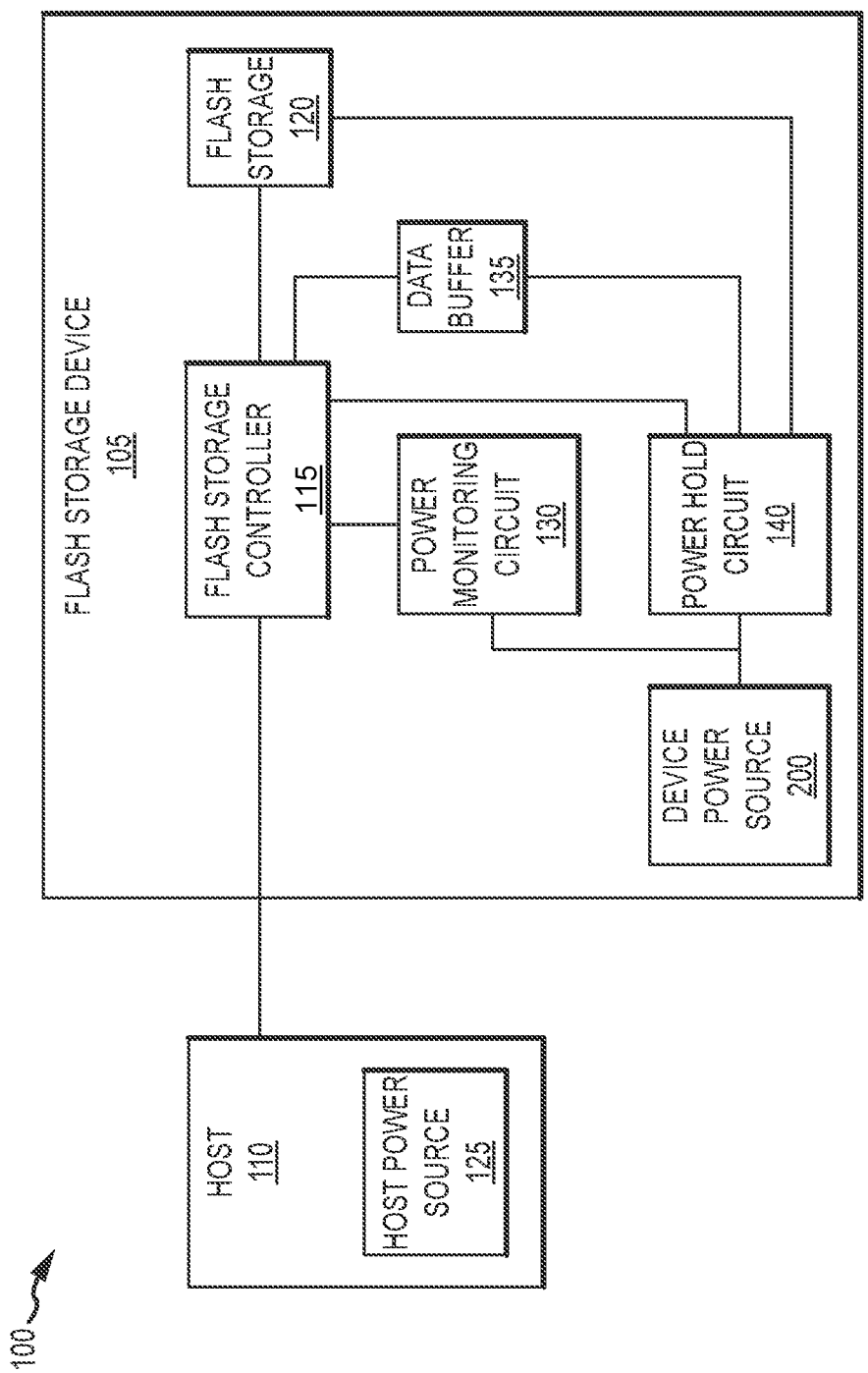
FIG. 2 is a block diagram of the electronic system including the flash storage device, in accordance with another embodiment of the present invention.

FIG. 2 illustrates the electronic system 100, in accordance with another embodiment of the present invention. In this embodiment, the electronic system 100 further includes a device power source 200. The device power source 200 instead of the host power source 125 (FIG. 1) is electrically coupled to the power monitoring circuit 130 and the power hold circuit 140. Also, the power monitoring circuit 130 monitors the device power source 200 instead of the host power source 125 to determine whether a power disruption occurs in the power supplied by the device power source 200 to the power hold circuit 140.

The device power source 200 supplies power to power hold circuit 140. In response to the power supplied to the power hold circuit 140 from the device power source 200, the power hold circuit 140 supplies power to the flash storage controller 115, the flash storage 120, and the data buffer 135. Moreover, the power hold circuit 140 stores power in response to the power received from the device power source 200.

The power hold circuit 140 provides power stored in the power hold circuit 140 to the flash storage controller 115, the flash storage 120, and the data buffer 135 if a power disruption occurs in the power supplied to the power hold circuit 140 from the device power source 200 during a data transfer. The power supplied by the power hold circuit 140 to the flash storage controller 115, the flash storage 120, and the data buffer 135 is sufficient to maintain integrity of data in the data transfer until the data transfer is completed. In this way, corruption of data in the flash storage 120 is avoided.

The power monitoring circuit 130 provides a signal to the flash storage controller 115 indicating a power disruption in the power supplied by the device power source 200 to the power hold circuit 140. In response to the signal from the power monitoring circuit 130, the flash controller 115 completes any data transfer in progress but inhibits a subsequent data transfer from occurring until the device power source 200 restores power to the power hold circuit 140.

Figure 3:
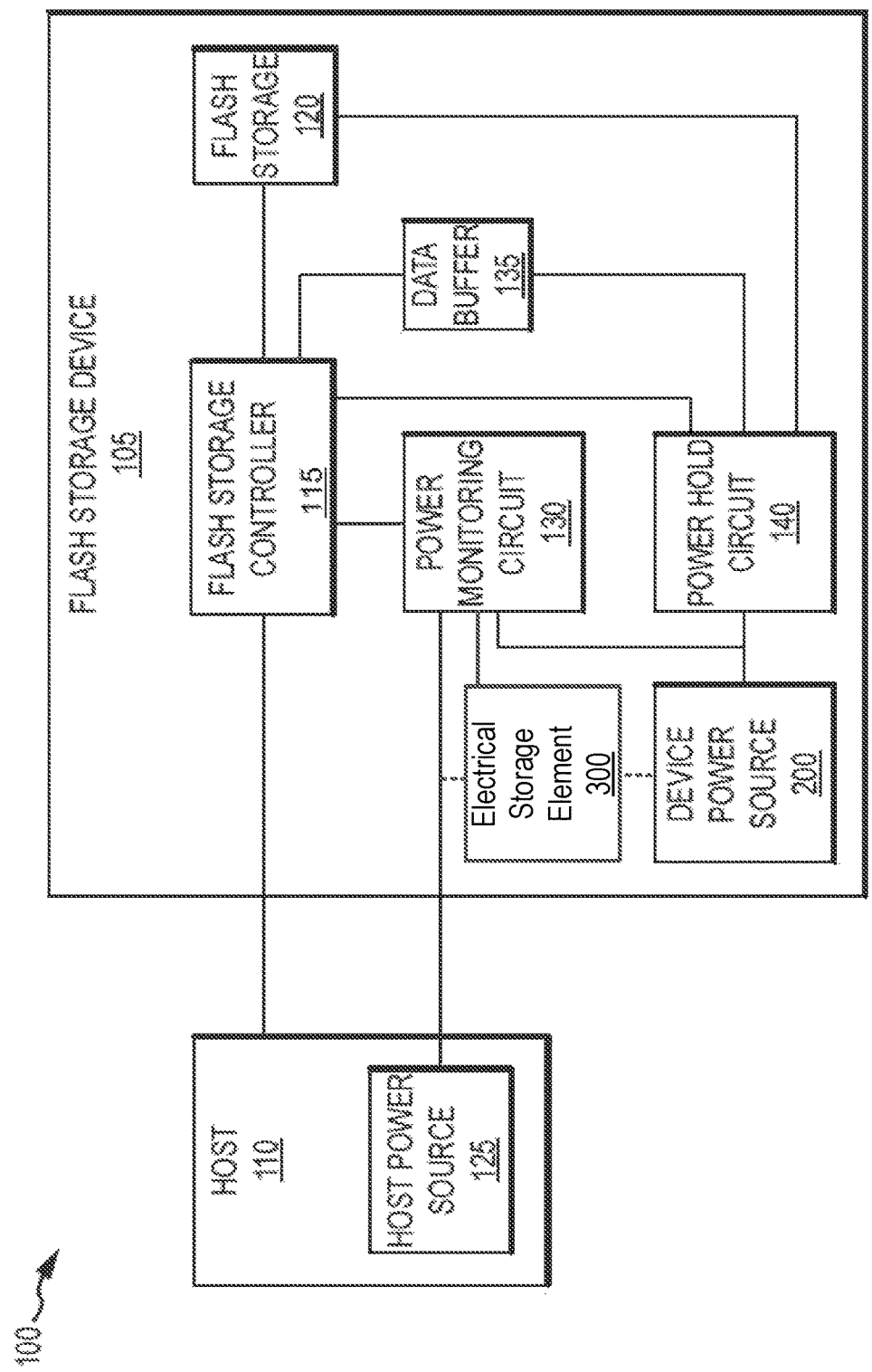
FIG. 3 is a block diagram of the electronic system including the flash storage device, in accordance with another embodiment of the present invention.

FIG. 3 illustrates the electronic system 100, in accordance with another embodiment of the present invention. In this embodiment, the electronic system 100 includes the device power source 200, which is electrically coupled to the power monitoring circuit 130, the power hold circuit 140 and an electrical storage element 300. Further, the host power supply 125 is electrically coupled to the power monitoring circuit 130. The power monitoring circuit 130 monitors both the host power source 125 and the device power source 200 to determine whether a power disruption occurs in the power supplied by the host power source 125 to the flash storage device 105 or in the power supplied by the device power source 200 to the power hold circuit 140.

In one embodiment, the power monitoring circuit 130 provides a signal to the flash storage controller 115 indicating a power disruption in either the power supplied by the host power source 125 to the flash storage device 105 or the power supplied by the device power source 200 to the power hold circuit 140. In response to the signal from the power monitoring circuit 130, the flash controller 115 completes any data transfer in progress but inhibits any additional data transfers from occurring until the host power source 125 restores power to the flash storage device 105 or the device power source 200 restores power to the power hold circuit 140.

Figure 4:
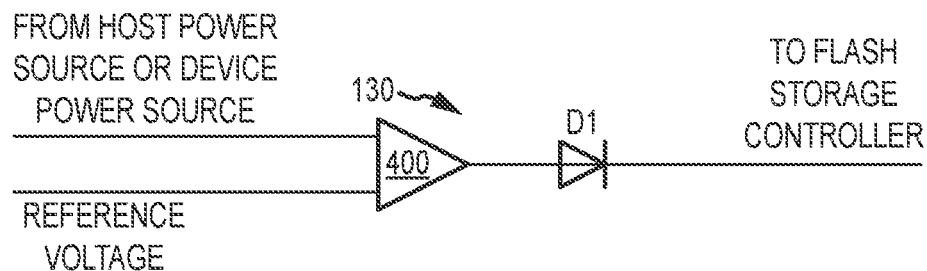
FIG. 4 is a schematic diagram of a power monitoring circuit, in accordance with an embodiment of the present invention.

FIG. 4 illustrates the power monitoring circuit 130, in accordance with an embodiment of the present invention. The power monitoring circuit 130 includes a comparator 400 electrically coupled to the host power source 125 (FIG. 1) or the device power source 200 (FIG. 2). The comparator 400 is also electrically coupled to a reference voltage.

The comparator 400 compares a voltage of the power supplied to the comparator 400 from either the host power source 125 (FIG. 1) or the device power source 200 (FIG. 2) with the reference voltage and generates an output indicating whether a power disruption occurs in the power from the host power source 125 or the device power source 200. The comparator 400 provides the output of the comparator 400 to the flash storage controller 115 (FIG. 1 or FIG. 2). If the output indicates a power disruption in the power supplied to the comparator 400 from the host power source 125 or the device power source 200, the flash storage controller 115 completes any data transfer in progress and inhibits any subsequent data transfer until the disrupted power is restored. In one embodiment, the comparator 400 generates a signal indicating a power disruption in the power supplied from the host power source 125 or the device power source 200 if the voltage of the power from the host power source 125 or device power source 200 is below the reference voltage.

In one embodiment, the flash storage device 105 (FIG. 1 or FIG. 2) includes the electrical storage element 300, such as a capacitor, electrically coupled to the comparator 400 and to either the host power source 125 (FIG. 1) or the device power source 200 (FIG. 2). The electrical storage element 300 charges to a voltage of the host power source 125 or the device power source 200, and maintains this voltage even though a power disruption occurs in power supplied by the host power source 125 or the device power source 200. Moreover, the electrical storage element 300 provides this voltage to the comparator 400 as the reference voltage.

In one embodiment, the power monitoring circuit 130 includes an optional diode D1 electrically coupled to the output of the comparator 400 and to the flash storage controller 115 (FIG. 1 or FIG. 2). The diode D1 inhibits current from flowing from the flash storage controller 115 to the comparator 400, for example after a power disruption occurs in power supplied from the host power source 125 (FIG. 1) or the device power source 200 (FIG. 2) to the comparator 400. In this way, the comparator 400 does not consume power from the flash storage controller 115 after a power disruption occurs in the flash storage device 105 (FIG. 1 or FIG. 2).

Figure 5:
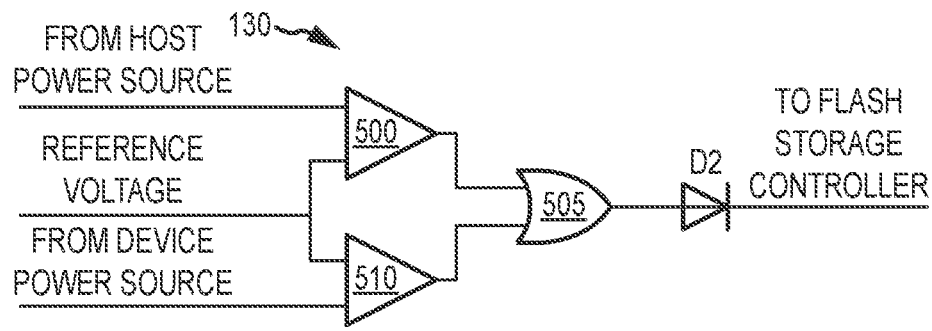
FIG. 5 is a schematic diagram of the power monitoring circuit, in accordance with another embodiment of the present invention.

FIG. 5 illustrates the power monitoring circuit 130, in accordance with another embodiment of the present invention. The power monitoring circuit 130 includes a comparator 500, a combining circuit 505, and a comparator 510. The comparator 500 is electrically coupled to the host power source 125 (FIG. 3) and the combining circuit 505. The comparator 510 is electrically coupled to the device power source 200 (FIG. 3) and the combining circuit 505. Each of the comparators 500 and 510 is also electrically coupled to a reference voltage. In one embodiment, the comparators 505 and 510 are differential operational amplifiers and the combining circuit 505 is a logical OR gate.

The comparator 500 compares the reference voltage with a voltage of the power supplied to the comparator 500 from the host power source 125 (FIG. 3) and generates an output based on the comparison indicating whether a power disruption occurs in the power from the host power source 125. Further, the comparator 500 provides the output of the comparator 500 to the combining circuit 505. The comparator 510 compares the reference voltage with a voltage of the power supplied to the comparator 510 from the device power source 200 and generates an output based on the comparison indicating whether a power disruption occurs in the power from the device power source 200 (FIG. 3). Further, the comparator 510 provides the output of the comparator 510 to the combining circuit 505.

In one embodiment, the comparator 500 generates a signal indicating a disruption in power supplied from the host power source 125 (FIG. 3) if the voltage of the power supplied from the host power source 125 is below the reference voltage. In another embodiment, the comparator 510 generates a signal indicating a disruption in power supplied from the device power source 200 if the voltage of the power from the device power source 200 is below the reference voltage.

The combining circuit 505 generates an output based on the outputs of the comparators 500 and 510 and provides the output to the flash storage controller 115 (FIG. 3). For example, the output of the combining circuit 505 can be an electrical signal. The output of the combining circuit 505 indicates whether a power disruption occurs in either the power supplied to the flash storage device 105 (FIG. 3) from the host power source 125 (FIG. 3) or the power supplied to the power hold circuit 140 (FIG. 3) from the device power source 200 (FIG. 3). If the output indicates that a power disruption occurs in the power supplied to the power monitoring circuit 130 (FIG. 3) from the host power source 125 or the device power source 200, the flash storage controller 115 completes any data transfer in progress and inhibits any subsequent data transfer until the disrupted power is restored.

In one embodiment, the flash storage device 105 (FIG. 3) includes the electrical storage element 300, such as a capacitor, electrically coupled to the comparators 500 and 510, as well as to either the host power source 125 (FIG. 3) or the device power source 200 (FIG. 3). The electrical storage element 300 charges to a voltage of the host power source 125 or the device power source 200, and maintains this voltage even though a power disruption occurs in power supplied by the host power source 125 or the device power source 200 to the power monitoring circuit 130 (FIG. 3). Moreover, the electrical storage element 300 provides this voltage to the comparators 500 and 510 as the reference voltage.

In one embodiment, the power monitoring circuit 130 includes an optional diode D2 electrically coupled to the output of the combining circuit 505 and to the flash storage controller 115 (FIG. 3). The diode D2 inhibits current from flowing from the flash storage controller 115 to the combining circuit 505, for example after a power disruption occurs in power supplied from the host power source 125 (FIG. 3) or the device power source 200 (FIG. 3) to the combining circuit 505. In this way, the combining circuit 505 does not consume power from the flash storage controller 115 after a power disruption occurs in the flash storage device 105 (FIG. 3).

Figure 6:
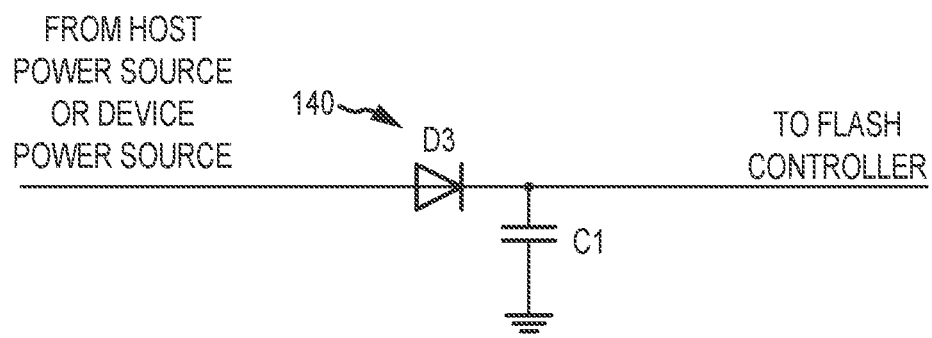
FIG. 6 is a schematic diagram of a power hold circuit, in accordance with an embodiment of the present invention.

FIG. 6 illustrates the power hold circuit 140, in accordance with an embodiment of the present invention. The power hold circuit 140 includes a diode D3 and a double layer capacitive element C1. In one embodiment, the double layer capacitive element C1 is a double layer capacitor, such as an ultracap developed by Lawrence Livermore National Laboratories of Livermore, Calif. For example, the capacitance of the double layer capacitor element C1 can be in the range of 0.11 F to 0.5 F. In another embodiment, the double layer capacitive element C1 is a series of double layer capacitors. For example, the double layer capacitive element C1 may include two 2.5V ultracaps in series, each of which has a capacitance in the range of 0.22 F to 1 F, which allows the double layer capacitive element C1 to charge to 5V in response to power supplied to the double layer capacitive element C1 from a 5V voltage source.

The diode D3 is electrically coupled to the host power source 125 (FIG. 1) or the device power supply 200 (FIG. 2 or FIG. 3) and receives power from the host power source 125 or the device power supply 200. Additionally, the diode D3 is electrically coupled to the flash storage controller 115 (FIG. 1, FIG. 2, or FIG. 3), the flash storage 120 (FIG. 1, FIG. 2, or FIG. 3), and the data buffer 135 (FIG. 1, FIG. 2, or FIG. 3). The diode D3 allows current to flow from the host power source 125 or the device power supply 200 through the diode D3 to the flash storage controller 115, the flash storage 120, and the data buffer 135. The diode D3 also allows current to flow from the host power source 125 or the device power supply 200 through the diode D3 into the double layer capacitive element C1 for charging the double layer capacitive element to a voltage. In this way, the power hold circuit 140 provides power having the voltage of the double layer capacitive element C1 to the flash storage controller 115, the flash storage 120, and the data buffer 135. Moreover, the diode D3 inhibits current from flowing from the double layer capacitive element C1, the flash storage controller 115, the flash storage 120, or the data buffer 135 into the host power source 125 or the device power supply 200. In this way, power stored in the double layer capacitive element C1 will not be consumed by the host power supply 125 or the device power supply 200 if a power disruption occurs in power supplied by the host power supply 125 or the device power supply 200 to the power hold circuit 140.

The power stored in the double layer capacitive element C1 is sufficient for the flash storage controller 115 to complete a data transfer into the flash storage 120, or a data transfer from the flash storage 120, if a power disruption occurs in the power supplied to the power hold circuit 140 from the host power source 125 or the device power source 200. In this way, corruption of data in the data transfer is avoided.

Figure 7:
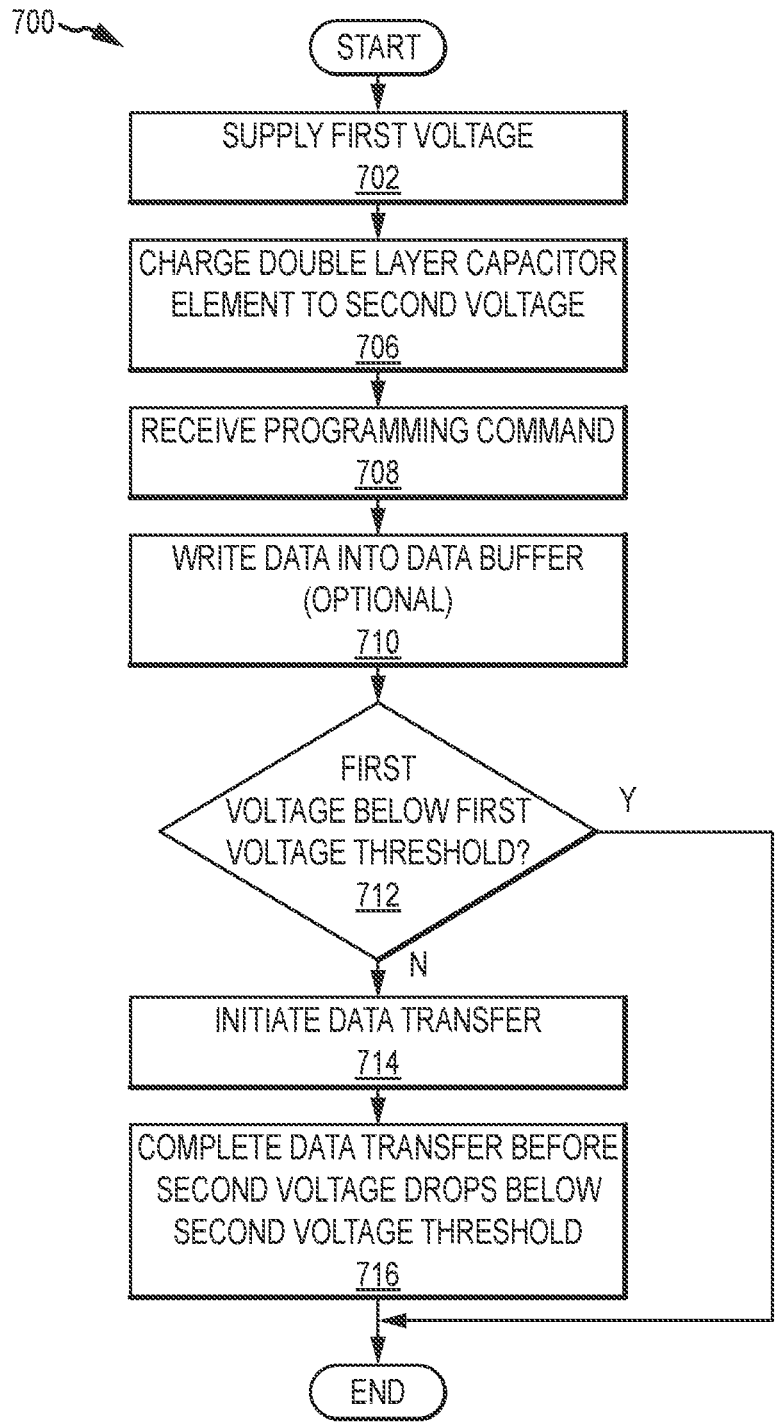
FIG. 7 is a flow chart for a method of maintaining data integrity in a flash storage device, in accordance with an embodiment of the present invention.

FIG. 7 illustrates a method 700 of maintaining data integrity in the flash storage device 105 (FIG. 1, FIG. 2, or FIG. 3), in accordance with an embodiment of the present invention. In step 702, a first voltage is supplied to the power hold circuit 140 (FIG. 1, FIG. 2, or FIG. 3) of the flash storage device 105 (FIG. 1, FIG. 2, or FIG. 3). In one embodiment, the host power source 125 (FIG. 1) of the host 110 (FIG. 1) supplies power having the first voltage to the power hold circuit 140. In another embodiment, the host power source 125 (FIG. 2 or FIG. 3) supplies power having the first voltage to the power hold circuit 140 (FIG. 2 or FIG. 3). The method 700 then proceeds to step 706.

In step 706, the double layer capacitor element C1 (FIG. 6) of the power hold circuit 140 (FIG. 6) is charged to a second voltage. In one embodiment, the double layer capacitor element C1 charges to the second voltage in response to the power supplied to the power hold circuit 140 (FIG. 1) from the host power source 125 (FIG. 1). In another embodiment, the double layer capacitor element C1 charges to the second voltage in response to the power supplied to the power hold circuit 140 from the device power source 200 (FIG. 2 or FIG. 3). Also in step 706, the power hold circuit 140 supplies power having the second voltage to the flash storage controller 115 (FIG. 1, FIG. 2, or FIG. 3), the flash storage 120 (FIG. 1, FIG. 2, or FIG. 3), and the data buffer 135 (FIG. 1, FIG. 2, or FIG. 3). The method 700 then proceeds to step 708.

In step 708, the flash storage controller 115 (FIG. 1, FIG. 2, or FIG. 3) receives a programming command from the host 110 (FIG. 1, FIG. 2, or FIG. 3) for accessing data in the flash storage device 105 (FIG. 1, FIG. 2, or FIG. 3). For example, the programming command can be a read command, a write command, or a read-modify-write command, as is described more fully herein. The method 700 then proceeds to step 710.

In optional step 710, the flash storage controller 115 (FIG. 1, FIG. 2, or FIG. 3) writes data into the data buffer 135 (FIG. 1) in response to the programming command received from the host 110 (FIG. 1, FIG. 2, or FIG. 3). In this process, the flash storage controller 115 can write data of the programming command, or data portions of the data, into the data buffer 135. Also in this process, the flash storage controller 115 can read data portions of the data in the flash storage 120 and write the data portions into the data buffer 135. The method 700 then proceeds to step 712.

In step 712, the power monitoring circuit 130 (FIG. 1, FIG. 2, or FIG. 3) determines whether a power disruption occurs in the flash storage device 105 (FIG. 1, FIG. 2, or FIG. 3). In one embodiment, the power monitoring circuit 130 compares the voltage of the power supplied to power hold circuit 140 (FIG. 1, FIG. 2, or FIG. 3) from the host power source 125 (FIG. 1) or the device power source 200 (FIG. 2 or FIG. 3) with a first voltage threshold to determine whether the power supplied to the power hold circuit 140 is below the first threshold voltage. For example, the first threshold value can be a voltage tolerance, such as a minimum output voltage, of the host power source 125 or the device power source 200. If the power supplied to the power hold circuit 140 from the host power source 125 or the device power source 200 is less than the first threshold voltage, the power monitoring circuit 130 provides a signal to the flash storage controller 115 (FIG. 1, FIG. 2, or FIG. 3) indicating a power disruption in the power supplied to the power hold circuit 140 and the method 700 ends. Otherwise, the method 700 proceeds to step 714.

In step 714, the flash storage controller 115 (FIG. 1, FIG. 2, or FIG. 3) initiates a data transfer before the voltage of the power supplied to the power hold circuit 140 (FIG. 1, FIG. 2, or FIG. 3) from the host power source 125 (FIG. 1 or FIG. 3) or the device power source 200 (FIG. 2 or FIG. 3) drops below the first voltage threshold. The voltage of the power supplied to the power hold circuit 140 from the host voltage source 125 or the device voltage source 200 can drop below the first voltage threshold, for example, if the power is disrupted (i.e., a power disruption occurs). For example, power may be disrupted if the host power source 125 is electrically disconnected from the flash storage device 105 (FIG. 1, FIG. 2, or FIG. 3). As another example, the power may be disrupted if the device power source 200 fails. The power disruption causes the voltage of the power supplied by the power hold circuit 140 to drop as the flash storage controller 115, the flash storage 120, and the data buffer 135 consumes the power. The method 700 then proceeds to step 716.

In step 716, the flash storage controller 115 (FIG. 1, FIG. 2, or FIG. 3) completes the data transfer before the voltage of the power supplied by the power hold circuit 140 (FIG. 1, FIG. 2, or FIG. 3) to the flash storage controller 115 (FIG. 1, FIG. 2, or FIG. 3), the flash storage 120 (FIG. 1, FIG. 2, or FIG. 3), and the data buffer 135 (FIG. 1, FIG. 2, or FIG. 3) drops below a second voltage threshold. The second threshold voltage is a voltage of the power supplied by the power hold circuit 140 to the flash storage controller 115, the flash storage 120, and the data buffer 135 at which integrity of the data in the data transfer is maintained. Once the data transfer is complete, the flash storage 120 stores the data. Moreover, the flash storage 120 continues to store the data after the voltage of the power supplied by the power hold circuit 140 to the flash storage 120 drops below the second voltage threshold. The method 700 then ends.

Although the invention has been described with reference to particular embodiments thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method of maintaining data integrity in a flash storage device, the method comprising:
supplying a first voltage;
supplying a second voltage;
applying the second voltage to a capacitive element to charge the capacitive element to a third voltage;
providing the third voltage to a flash storage controller and a flash storage;
applying one of the first voltage or the second voltage to an electrical storage element to charge the electrical storage element to a first threshold voltage;
providing the first threshold voltage to a power monitoring circuit;
providing a comparator output from the power monitoring circuit to the flash storage controller, the comparator output being based on a combination of a first comparison of the first voltage with respect to the first threshold voltage and a second comparison of the second voltage with respect to the first threshold voltage;
determining that the first voltage and the second voltage are each greater than the first threshold voltage at which there is no disruption in power;
initiating a data transfer in the flash storage;
determining that the third voltage is greater than a second threshold voltage at which data integrity is maintained for the data transfer; and
completing the data transfer in the flash storage.

2. The method of claim 1, wherein the electrical storage element is charged to the first threshold voltage when the comparator output indicates no disruption in the first voltage and the second voltage.

3. The method of claim 1, wherein the first voltage is supplied from a first power source and the second voltage is supplied from a second power source.

4. The method of claim 1, further comprising providing the second voltage to a hold circuit, the hold circuit comprising the capacitive element.

5. The method of claim 4, further comprising: providing the third voltage from the hold circuit to a data buffer; receiving a programming command from a host; and writing a plurality of data portions into the data buffer in response to the programming command.

6. The method of claim 4, further comprising inhibiting current flow from the flash storage controller to the hold circuit when the comparator output indicates disruption in power supplied by the first voltage or the second voltage.

7. The method of claim 1, further comprising:
monitoring the first voltage;
determining that the first voltage is smaller than the first threshold voltage; and
inhibiting a subsequent data transfer from occurring in the flash storage based on the determination that the first voltage is smaller than the first threshold voltage.

8. The method of claim 1, further comprising:
monitoring the second voltage;

determining that the second voltage is smaller than the first threshold voltage; and inhibiting a subsequent data transfer from occurring in the flash storage based on the determination that the second voltage is smaller than the first threshold voltage.

9. A system for maintaining data integrity in a flash storage device, the system comprising:
 a flash storage;
 a data buffer;
 a power hold circuit electrically coupled to the flash storage and the data buffer;
 a power monitoring circuit electrically coupled to an output of the power hold circuit, the power monitoring circuit configured to receive a first voltage from a device power source and a second voltage from a host power source, the power monitoring circuit configured to generate a comparator output based on a combination of a first comparison of the first voltage with respect to a first threshold voltage and a second comparison of the second voltage with respect to the first threshold voltage;
 an electrical storage element electrically coupled to an input to the power monitoring circuit, the electrical storage element configured to supply the first threshold voltage to the power monitoring circuit based on one of the first voltage or the second voltage; and
 a flash storage controller electrically coupled to the flash storage, the data buffer, the power hold circuit and the power monitoring circuit, the flash storage controller configured to initiate a data transfer to the flash storage via the data buffer based on a determination that the first voltage and the second voltage are each greater than the first threshold voltage, and the flash storage controller configured to complete the data transfer based on a determination that a third voltage from the power hold circuit is greater than a second threshold voltage at which data integrity is maintained for the data transfer.

10. The system of claim 9, wherein the flash storage controller is configured to:
 write one or more portions of data into the data buffer;
 read the one or more portions of data from the data buffer; and
 write the one or more portions of data read from the data buffer into the flash storage.

11. The system of claim 9, wherein the flash storage controller is configured to:
 read one or more portions of data from the flash storage;
 write the one or more portions of data read from the flash storage into the data buffer; and
 read the one or more portions of data from the data buffer.

12. A data storage system, comprising:
 means for supplying a first voltage;
 means for supplying a second voltage;
 means for applying the second voltage to a capacitive element to charge the capacitive element to a third voltage;
 means for providing the third voltage to a flash storage controller and a flash storage;
 means for applying one of the first voltage or the second voltage to an electrical storage element to charge the electrical storage element to a first threshold voltage;
 means for providing the first threshold voltage to a power monitoring circuit;
 means for providing a comparator output from the power monitoring circuit to the flash storage controller, the comparator output being based on a combination of a first comparison of the first voltage with respect to the first threshold voltage and a second comparison of the second voltage with respect to the first threshold voltage;
 means for determining that the first voltage and the second voltage are each greater than the first threshold voltage at which there is no disruption in power;
 means for initiating a data transfer in the flash storage;
 means for determining that the third voltage is greater than a second threshold voltage at which data integrity is maintained for the data transfer; and
 means for completing the data transfer in the flash storage.

13. The data storage system of claim 12, comprising:
 means for charging the electrical storage element to the first threshold voltage when the comparator output indicates no disruption in the first voltage and the second voltage.

14. The data storage system of claim 12, wherein the first voltage is supplied from a first power source and the second voltage is supplied from a second power source.

15. The data storage system of claim 12, comprising:
 means for providing the second voltage to a hold circuit, the hold circuit comprising the capacitive element.

16. The data storage system of claim 15, comprising: means for providing the third voltage from the hold circuit to a data buffer; means for receiving a programming command from a host; and means for writing a plurality of data portions into the data buffer in response to the programming command.

17. The data storage system of claim 15, comprising:
 means for inhibiting current flow from the flash storage controller to the hold circuit when the comparator output indicates disruption in power supplied by the first voltage or the second voltage.

18. The data storage system of claim 12, comprising:
 means for monitoring the first voltage;
 means for determining that the first voltage is smaller than the first threshold voltage; and
 means for inhibiting a subsequent data transfer from occurring in the flash storage based on the determination that the first voltage is smaller than the first threshold voltage.

19. The data storage system of claim 12, comprising:
 means for monitoring the second voltage;
 means for determining that the second voltage is smaller than the first threshold voltage; and
 means for inhibiting a subsequent data transfer from occurring in the flash storage based on the determination that the second voltage is smaller than the first threshold voltage.

* * * * *